United States Patent [19]
Cavazza

[11] Patent Number: 5,013,586
[45] Date of Patent: May 7, 1991

[54] METHOD AND DEVICE FOR THE UNIFORMLY EVEN APPLICATION OF A RESIN COATING ON A SUBSTRATE

[75] Inventor: Gilbert Cavazza, Viuz-en-Sallaz, France

[73] Assignee: Société Anonyme dite: Sulzer Electro-Technique "S.E.T.", Saint-Jeoire, France

[21] Appl. No.: 407,362

[22] Filed: Sep. 14, 1989

[30] Foreign Application Priority Data

Sep. 15, 1988 [FR] France .................. 88 12045

[51] Int. Cl.⁵ .................. B05D 3/12; B05C 11/02
[52] U.S. Cl. .................. 427/240; 118/52; 437/231; 427/336; 427/377
[58] Field of Search .................. 427/240, 377, 336; 118/52; 437/231

[56] References Cited

U.S. PATENT DOCUMENTS

| | | | |
|---|---|---|---|
| 2,632,725 | 3/1953 | Marks et al. | 427/240 |
| 4,068,019 | 1/1978 | Boeckl | 427/240 |
| 4,075,974 | 2/1978 | Plows | 118/52 |
| 4,086,870 | 5/1978 | Canavello et al. | 118/52 |
| 4,587,139 | 5/1986 | Hagan | 427/240 |

OTHER PUBLICATIONS

*Apparatus for Preventing Rebounding of Spinner*, Patent Abstract of Japan, vol. 11, No. 259, Aug. 21, 1987.
*Spinner*, Patent Abstract of Japan, vol. 9, No. 230, Sep. 17, 1985.
*Coating Device*, Patent Abstracts of Japan, vol. 9, No. 318, Dec. 13, 1985.
"Controlled Gap Photoresist Spinning Process" in IBM Tech. Disclosure Bulletin, vol. 17, No. 11, Apr. 1975.

*Primary Examiner*—Janyce Bell
*Attorney, Agent, or Firm*—Marshall, O'Toole, Gerstein, Murray & Bicknell

[57] ABSTRACT

Method and device for the uniformly even application of a resin coating on a substrate, wherein it comprises a rotary plate (1) receiving the substrate (3) and provided with means for rendering the substrate stationary on the plate so that rotation of the plate (1) provokes the spreading of a thin coating of the resin over the surface of the substrate. A concentric cover (3) is superimposed on the circular plate (1) and provokes the rotation of this cover along with the plate by confining the gaseous volume constituted by a suspended solvent preserving the properties of the dissolved resin during the spreading cycle constituting the internal atmosphere in which the substrate is placed, this volume being driven in rotation approximately synchronous with the plate and the cover.

10 Claims, 2 Drawing Sheets

METHOD AND DEVICE FOR THE UNIFORMLY EVEN APPLICATION OF A RESIN COATING ON A SUBSTRATE

FIELD OF THE INVENTION

The present invention concerns a method and device to implement the method making it possible to distribute and deposit a thin coating film of a liquid product on the surface of a substrate, particularly via a centrifuging effect.

BACKGROUND OF THE INVENTION

More particularly, the invention is applicable to depositing an extremely thin coating of a photosensitive resin on the surface of a substrate embodied by any material, especially a semiconducting metal, such as silicon.

In particular, it is known that as regards embodying integrated circuits, assuming the embodiment stage where successive coatings each comprise a conductive network, each stage is embodied by depositing a photosensitive resin on a substrate, which is then insulated with a suitable mask being interposed followed by fixing so as to embody the network corresponding to the stage involved.

The embodiment of ultra-miniaturized integrated circuits requires depositings of extremely thin coatings of photosensitive resin (referred hereafter as "resin") so as to make it possible to obtain an extremely fine definition as regards each stage.

The technique currently used to obtain a thin coating resin film consists of depositing the liquid resin dissolved in a solvent on the receiving substrate, the latter generally being a circular or four-sided plate.

The plate is firstly deposited and kept on a gyratory plate; the plate is immediately subjected to rotation which, via the effect of centrifugal force, provokes spreading of the extremely thin uniform coating of the liquid constituted by the resin solution and the solvent over the surface of the substrate.

The extreme volatility of the solvent requires that rotation is effected with high accelerations so that correct spreading is obtained before evaporation of the solvent significantly modifies the viscosity of the solvent/resin mixture.

The initial depositing of the dissolved resin may then be effected when the plate is stationary, but it is also possible to deposit the dissolved resin in an initial phase during which the substrate is already slowly rotating, which facilitates the initial dispersion movement over the entire surface fast rotation with subsequent high acceleration is aimed at eliminating from the surface of the substrate the excess resin which is then projected outwardly and then collected on the walls of a bowl inside which the gyratory plate is mounted.

The search for films of increasingly reduced thickness on increasingly large substrates is resulting in the use of more elaborate techniques respectively acting on the nature of the dissolved resin, especially its concentration and certain properties, especially the volatility of the solvent, as well as acting on the operational conditions, especially the speed of rotation, acceleration intensity, etc. As a reminder, mention is made here of the essential precautions required linked to the perfect purity and stability of the environment, especially by entirely eliminating dust which, once it has settled, would generate an unacceptable source of distortion as regards the required scale of miniaturization.

However, it is clear that the more the size of the substrate is increased whilst decreasing the thickness of the deposited resin film, especially by seeking to obtain film thicknesses of less than one micron, the operational difficulties and conditions become increasingly difficult to implement and control in order to obtain, not only a resin film of reduced thickness, but also an essentially required resin film with a constant and homogeneous thickness.

In effect, the thickness of the film needs to be perfectly even over the entire surface of the substrate.

Apart from the nature (viscosity linked to concentration) of the resin solution, it may be possible to try to reduce the thickness by acting on acceleration and the speed of rotation; thus, accelerations are used able to bring the speed of rotation up to 10,000 revs per minute in one second.

However, experience shows that problems then arise linked to interference between the air and the static gaseous volume located above the substrate and the rotary substrate, as well as the liquid film being fixed and borne by the substrate.

The accelerations thus implemented do not enable a displacement speed gradient of the air (or the gaseous layer) located above the substrate to be established and firstly the interference between the liquid surface driven in rotation during stabilization and hardening and secondly the static or semi-static air causes interference expressed by surface distortions in the form of wrinkles or waves able to be detected by, in particular, optical means.

But in particular the technique thus described becomes totally unsuitable when it is desired to embody spreading of the resin on, for example, four-sided substrates so as to have them exploited as part of embodying flat screens.

In fact, when the four-sided substrate, especially a square-shaped one, is rotated, each angle constitutes a leading edge of the air and consequently generates turbulence which significantly interferes with the spreading and distribution of the liquid film over the surface of the substrate.

As a result, the embodiment of square substrates or plates bearing a photosensitive resin film is consequently accompanied in each angle by a zone revealing traces of turbulences encountered by the liquid when the latter is distributed and resulting in particular in inequalities of the thickness of the resin film expressed in particular by segments of turns marking the angles of the substrate.

Consequently, it currently seems impossible via existing techniques to embody square substrates or plates bearing a thin coating of a resin film of uniform thickness by using the previously described centrifuging and gyratory techniques.

SUMMARY OF THE INVENTION

The invention overcomes this problem and makes it possible to avoid interference between the rotary substrate bearing the resin during spreading and the gaseous volume in which it is inserted. It also resolves the difficulties of increasing the coated surface of the resin film by a better control of evaporation of the solvent.

The invention also thus makes it possible to obtain four-sided and circular substrates comprising a thin coating resin film with a fully even homogeneous thickness of less than one micron.

The method and device of the invention also make it possible to retain the possibilities of modulating and adapting thickness by selectively using the resin in its solvent.

To this effect, the invention concerns a method to coat a substrate, especially a substrate made of a semi-conductive metal, such as silicon, or one made of a mineral, such as glass, with, for example, a photosensitive resin coating in order to produce integrated circuits, whereby a dissolved resin dose is deposited on the substrate in a position on a circular o rotary plate, after which the resin is immediately spread as a thin coating by the rapid accelerated rotation of the plate at the same time as evaporation of the solvent allows the resin coating with the desired thickness to be substituted on the substrate, said method being characterized in that the surface of the rotating substrate and bearing the resin dissolved in the solvent currently evaporating is protected from any interference between the rotating substrate and the ambient gaseous atmosphere, and to this effect at least the gaseous coating located above the substrate is rotary-driven to be approximately synchronous with the substrate borne by the plate.

More particularly within the context of the method of the invention, means for partitioning off the gaseous space are disposed above the plate and the substrate and are rotary-driven with the plate so as to provoke rotation of the layers of the gaseous atmosphere located immediately above the plate and the substrate bearing the dissolved resin and during spreading.

The invention also concerns a device for implementing said method and more particularly concerns a device for the coating of a substrate, especially one made of a semi-conductive metal, such as silicon, or one made of a mineral, such as glass, with, for example, a photosensitive resin coating with a view to producing integrated circuits, the device being of the type comprising a dissolved resin source suitable for being deposited on the surface of the substrate and a rotary plate receiving the substrate and provided with means for rendering said substrate to be stationary on the substrate, wherein said device comprises means for partitioning off the gaseous space located above the plate, said partitioning means being suitable for being rotated to be synchronous with the plate and accordingly being provided so as to drive the gaseous atmosphere layer located above the substrate in a movement of rotation synchronous with the latter.

More particularly in order to implement the method of the invention, a concentric cover is superimposed on the circular plate, said cover defining a gaseous volume containing the substrate, said cover being made to rotate along with the plate confining the gaseous volume constituting the internal atmosphere whose solvent controlled saturation preserves the viscous quality of the dissolved resin and in which the substrate is placed, this volume being rotary-driven synchronous with the plate and the cover.

In one embodiment for using the device of the invention, it has accordingly been provided that said partitioning means are constituted by a cover formed in particular of an inverted bowl and resting via its edges on the plate above the edges of the substrate.

In particular, it has been provided that the cover is movable-mounted so as to allow for placing of the substrate, said cover being mounted on a spin axis suitable for coming into a collinear position with respect to the spin axis of the lower plate, thus allowing for the matched synchronous and concentric rotation between the plate and the cover, said cover being driven by the plate.

According to a further characteristic of the invention, the cover is rotary-mounted on a transversal arm suitable for diametrically overhanging the gyratory plate, said arm supporting the cover being able to be moved between an inactive position allowing for access to the plate with a view to depositing or removing the substrate, as well as the initial deposit of the dissolved resin on said substrate, and an active position in which the cover is brought into contact and rests on the plate.

According again to a further characteristic of the invention, the arm bears the cover by means of a spin axis formed by a crown rolling bearing whose center is left free so as to allow for passage of the dissolved resin admission pipe and ending at one or more discharging nozzles overhanging the plate.

According to one special implementation feature of the invention, the resting of the cover on the receiving plate is effected without imperviousness by accordingly permitting the passage and thus the release of the centrifugal force of the excess dissolved resin freed from the substrate.

Again, according to a further characteristic of the invention, the arm bearing the cover is laterally articulated mounted and is able to be moved angularly within a vertical plane and diametral to the gyratory plate and is thus able to be moved between an inactive position and an active position where it diametrically overhangs the plate by keeping the cover in a rest position on said plate.

The arm also comprises locking means enabling said arm to be rendered stationary in the active position, as well as in the inactive position.

Again, according to a further characteristic of the invention, the support of the cover kept on the receiving plate by the arm is obtained by means of a spring calibrated at a value allowing for a support of the cover so that it allows the dissolved resin to flow between the lower plate and the upper cover during the centrifuging phase.

BRIEF DESCRIPTION OF THE DRAWING

Other characteristics and advantages of the invention shall appear more readily from a reading of the following description given in relation to an embodiment presented more particularly by way of example and accompanied by the annexed drawings.

DETAILED DESCRIPTION OF THE PREFERRED EMBODIMENTS

Figure 1:
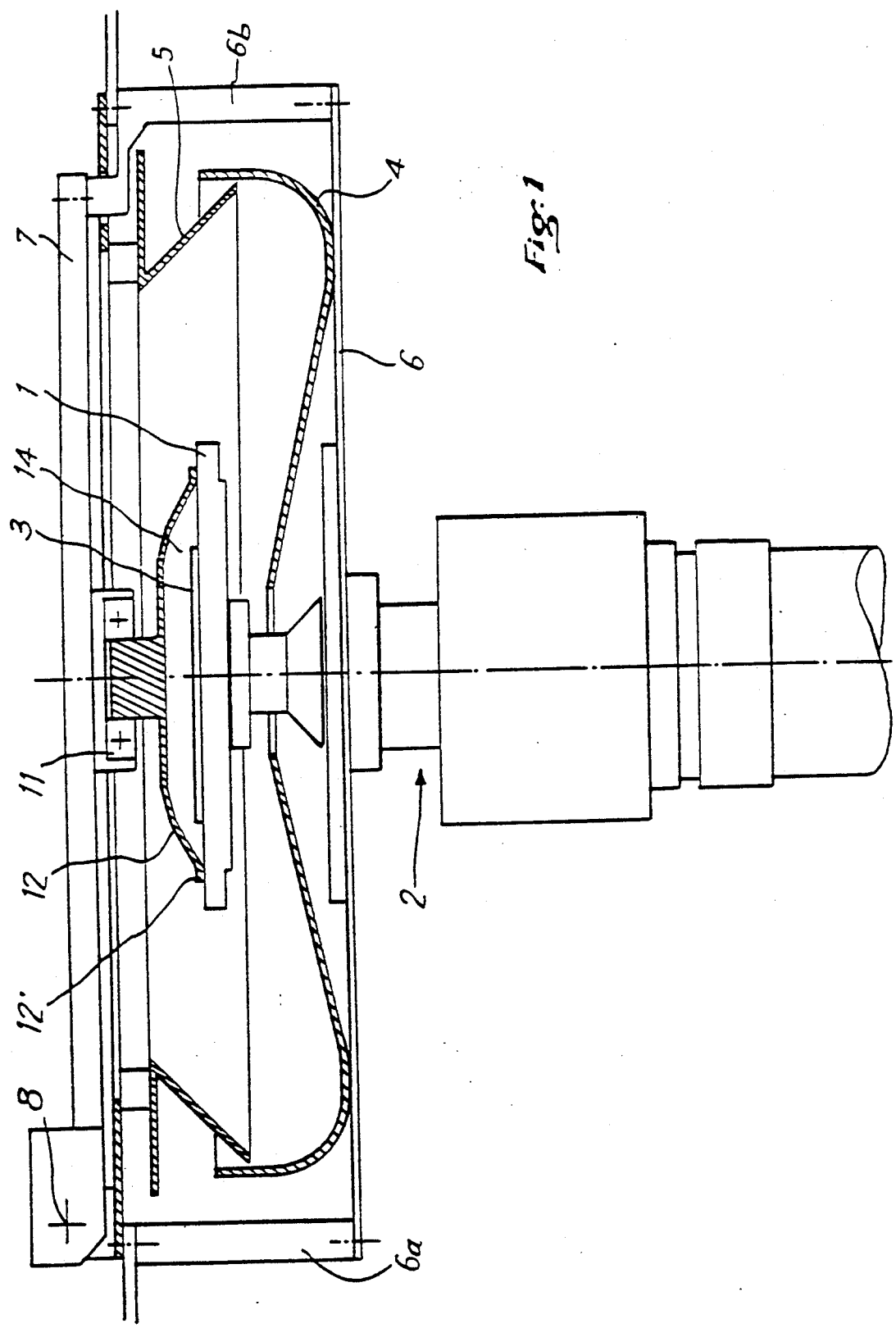
FIGS. 1 and 2 represent a horizontal cutaway diagrammatic view of a centrifuging plate embodied according to the invention.
Figure 2:
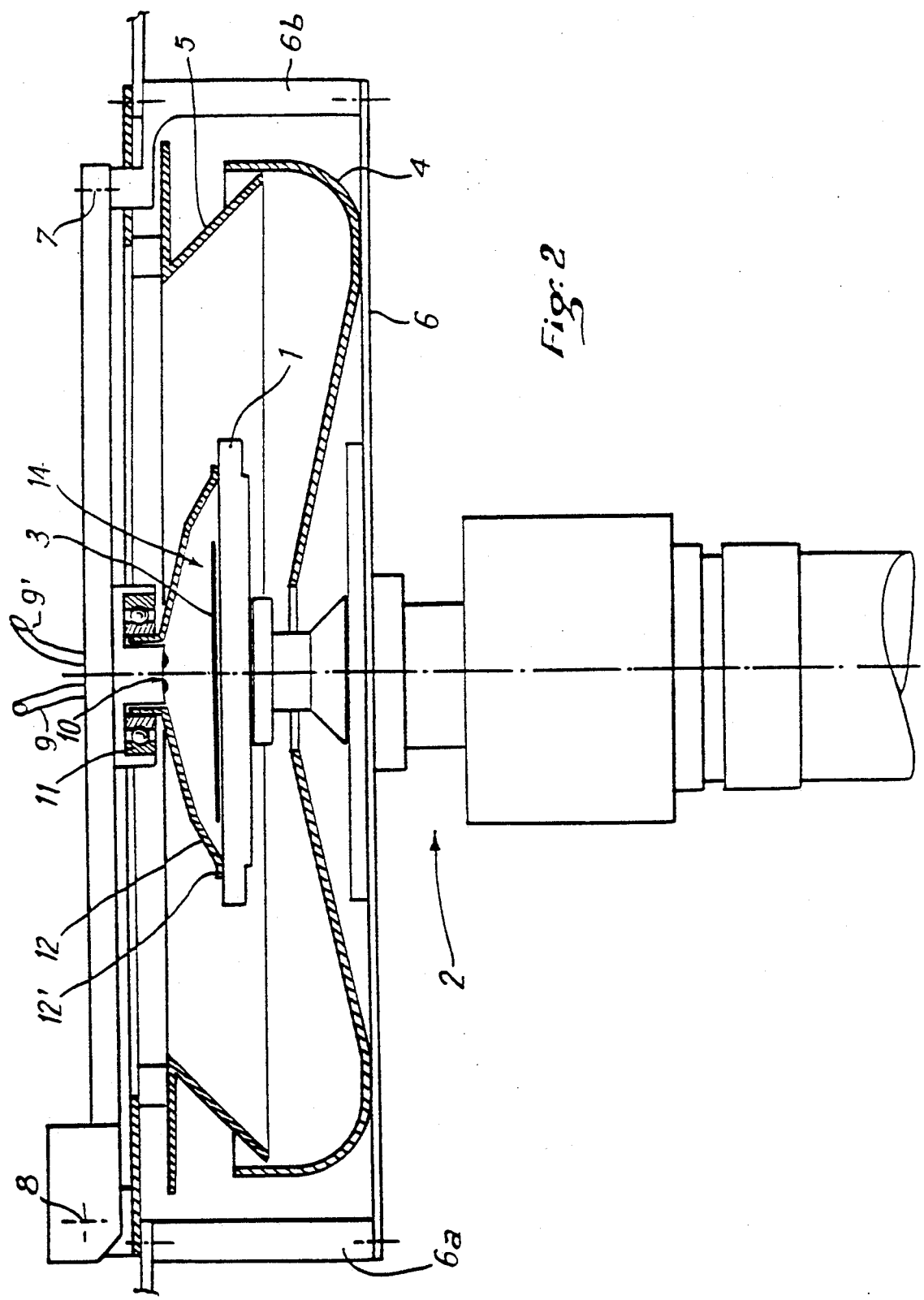

FIGS. 1 and 2 have represented the rotary plate 1 mounted on a vertical shaft 2 driven from a motor device in a lower position (not represented).

The substrate 3, here formed by a square or circular-shaped substrate, is laid on the plate 1.

The substrate 3 is kept in position on the plate 1, especially during the rotating phase with fast acceleration, by a suction device connected to another vacuum source (not represented) and traversing the central part of the receiving plate 1.

A fixed assembly is maintained around this rotary device, said assembly being constituted by the lower bowl 4 and the upper deflector 5.

The lower bowl 4 is mounted on the base 6 and comprises at its central part a slot traversed by the spindle 2.

For its part, the upper deflector 5 is rigidly mounted to the base 6 and 7 which overhangs the plate 1 and the peripheral bowl 4.

The arm 7 is joined at 8 and is thus able to be moved along a vertical plane diametral with respect to the rotary plate 1 along the spindle 8.

Thus, the arm 7 is able to be moved between an inactive position, where it is approximately vertical above the spindle 8, and an active position where it overhangs the plate, as represented on the figure.

According to FIG. 2, this arm is traversed at its central part respectively by the pipes 9 and 9' which allow for admission of the dissolved resin in a suitable volatile solvent and emerging towards the lower nozzle 10, itself overhanging the receiving plate 3.

According to the invention, the arm 7 supports a crown rolling bearing 11 whose central part is hollowed so as to allow for the passage of the pipes 9 and 9', the cover 12 being rotary-mounted on this rolling bearing.

According to FIGS. 1 and 2, this inverse-shaped bowl comes to rest via its edges 12' on the upper wall of the plate 1, whereas its central part is mounted rotating on the rolling bearing 11.

The spin axis of the cover 11 is strictly collinear with the spin axis of the plate 1.

In this way, at the time the plate is rotated, the movement is naturally imparted to the cover 12.

The arm 7 can be locked on the assembly constituted by the base 6 and the lateral stays 6a, 6b.

The pressure of the cover 12 on the lower plate 1 is calibrated so as to avoid any imperviousness contact between the edges of the cover 12' and the plate 1.

There now follows a description of the functioning of the above-mentioned assembly.

According to FIG. 2, initially the nozzle 10 deposits a suitable quantity of resin in its volatile solvent on the substrate 3 which may then be slowly rotary-driven so as to allow for a first distribution of the resin in its solvent over the surface of the substrate.

Then the speed of rotation of the plate 1 is increased, which causes the centrifugal offset of the resin in its solvent to move outwards.

At the same time, the extremely volatile solvent is partially confined between the plate 1 and the cover 12.

But the simultaneous and homogeneous rotation of the assembly formed by the plate 1 and its cover 12 rotary-drive at the same time the internal atmosphere confined between the cover 12 and the plate 1, so that the gaseous atmosphere located above the substrate is rotary-driven at the same time or roughly at the same time as the latter by thus avoiding interference, vortexes and risks of distortion in distributing the liquid film constituted by the dissolved resin on the surface of the substrate.

The above-mentioned effects in the previous paragraph can also be obtained in the case where the substrate has a square shape.

In this case, the angular parts formed by the corners of the substrate are no longer brought at accelerated speed to violently penetrate the gaseous atmosphere which, enclosed and confined between the plate and the cover, is rotary-driven roughly at the same time and subjected to the same acceleration as the substrate and the liquid film which constitute the interface between the substrate and the gaseous atmosphere.

However, a sealed contact has been avoided being provoked between the edges of the cover and the plate, so that the suspended excess resin in the liquid state projected violently outwardly is able to slide and flow between the plate and the cover so as to escape from the chamber constituted by the internal space defined between the plate and the cover; thus, a solution excess is avoided and especially a solvent excess which would risk poisoning the internal atmosphere of the chamber by solvent supersaturation likely to cause the solvent to deform the resin film at the end of the operation.

In particular, it may be provided that the space on top, which encompasses the central tubes 9, 9' and the rolling bearing 11, may be closed or opened according to the circumstances and especially according to the viscosity (namely, the concentration) of the solution and thus according to the steam pressure of the solvent being discharged at the time the film is embodied.

It is also possible to provide radial baffles disposed on the internal wall of the cover 12 so as to divide the internal space of the chamber 14 into a plurality of sectors partitioned off from each other, each sector corresponding to a partial atmosphere above the substrate and driving its own atmosphere in a movement above the substrate, thus more completely avoiding any distortion or speed gradient between the film during distribution and drying on the substrate and its corresponding atmosphere overhanging it.

The tests and experiments carried out by the Applicant have thus made it possible to embody films with perfect evenness and thickness ranging up to a figure of less than 0.5 microns corresponding to a particularly precise and fine definition concerning the embodiment of integrated circuits thus authorizing a particularly advanced miniaturization.

What is claimed is:

1. Method to coat a substrate with a photosensitive resin coating, wherein a dissolved resin dose is deposited on the substrate in position on a circular rotary plate, after which the resin is immediately spread as a thin layer by the fast and accelerated rotation of the plate at the same time as evaporation of the solvent allows the resin coating of the desired thickness to be deposited on the plate and wherein a concentric cover defining along with said circular plate a gaseous volume encompassing the substrate is superimposed on the circular plate and wherein this cover is made to rotate with the plate so that said gaseous volume is driven in rotation synchronous with the plate and the cover.

2. Device for coating a substrate with a resin, said device comprising:
   a rotatable plate,
   means for attaching said substrate on said plate,
   means for depositing a dose of said resin dissolved in a volatile solvent on the surface of said substrate, and
   a cover defining with said plate a volume enclosing said substrate, said cover being adapted to rotate synchronously with said plate,
   whereby atmosphere in contact with said substrate within said volume also rotates synchronously with said substrate.

3. Device according to claim 2, wherein said partitioning cover is formed from an inverted bowl resting via its edges on the plate above the edges of the substrate.

4. Device according to claim 2, wherein the cover is movable-mounted so as to allow for placing of the substrate and subsequently the initial depositing of the resin, this cover being mounted on a spin axis suitable for coming into a collinear position with respect to the spin axis of the lower plate, thus allowing for the matched synchronous and concentric rotation between the plate and the cover, said cover being driven by the plate.

5. Device according to claim 4, wherein the cover is rotary-mounted on a transversal arm suitable for diametrically overhanging the rotary plate, this arm supporting the cover being able to be moved between an inactive position, allowing for access to the plate with a view to the depositing or removal of the substrate and possibly the initial resin deposit, and an active position in which the cover is brought into contact and rests on the plate.

6. Device according to claim 5, wherein the arm bears the cover by means of a spin axis formed by a rolling bearing whose center is left free so as to allow for the passage of the dissolved resin admission pipe and ending at one or more discharging nozzles overhanging the plate.

7. Device according to claim 3, wherein the support of the edge of the cover on the receiving plate is embodied without imperviousness, thus allowing for the passage and accordingly the escape of the centrifugal force of the excess dissolved resin from the substrate.

8. Device according to claim 5, wherein the arm bearing the cover is articulated laterally mounted and is able to be moved angularly within a vertical plane and diametrical to the rotary plate so as to be able to be moved between an inactive position and an active position where it diametrically overhangs the plate by keeping the cover in the rest position on said plate.

9. Device according to claim 5, wherein the arm comprises locking means enabling said arm to be rendered stationary in the active position, as well as in the inactive position.

10. Device according to claim 3, wherein the support of the cover kept on the receiving plate by the arm is obtained by means of a spring calibrated to a value allowing for a support of the cover so that it allows the dissolved resin to flow between the lower plate and the upper cover during the centrifuging phase.

* * * * *